United States Patent
Norimatsu

(10) Patent No.: US 8,488,864 B2
(45) Date of Patent: Jul. 16, 2013

(54) EMISSION ANALYSIS DEVICE, METHOD AND SYSTEM

(75) Inventor: Kenji Norimatsu, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 608 days.

(21) Appl. No.: 12/727,498

(22) Filed: Mar. 19, 2010

(65) Prior Publication Data

US 2011/0038506 A1 Feb. 17, 2011

(30) Foreign Application Priority Data

Aug. 11, 2009 (JP) .................................. 2009-186494

(51) Int. Cl.
*G06K 9/00* (2006.01)
(52) U.S. Cl.
USPC ................. 382/141; 355/53; 438/16; 356/51; 356/237.1; 382/144; 382/195; 382/218
(58) Field of Classification Search
USPC ................. 382/100, 149, 144, 195, 224, 218; 356/237.1–237.6, 51; 438/16; 355/53
See application file for complete search history.

(56) References Cited

U.S. PATENT DOCUMENTS

| 6,553,546 | B1 | 4/2003 | Murakami | |
|---|---|---|---|---|
| 7,388,979 | B2 * | 6/2008 | Sakai et al. | .................... 382/144 |
| 7,523,027 | B2 * | 4/2009 | Chang et al. | .................... 703/13 |

FOREIGN PATENT DOCUMENTS

| JP | 06151543 | 5/1994 |
|---|---|---|
| JP | 2004045132 | 2/2004 |

* cited by examiner

*Primary Examiner* — Gregory J Toatley
*Assistant Examiner* — Iyabo S Alli
(74) *Attorney, Agent, or Firm* — White & Case LLP

(57) ABSTRACT

An emission analysis device has an image obtaining module configured to obtain a plurality of first images and a plurality of second images by changing multiple times an end test pattern address, the first images being obtained by integrating an emission from a nondefective semiconductor device determined to be nondefective by a function test while test patterns from a predetermined start test pattern address to the end test pattern address are inputted to the nondefective semiconductor device, the second images being obtained by integrating an emission from a defective semiconductor device determined to be defective by the function test while the test patterns from the predetermined start test pattern address to the end test pattern address are inputted to the defective semiconductor device, and a comparator configured to compare each of the first images with each of the second images by the end test pattern address to determine whether there is a difference between the first images and the second images.

20 Claims, 9 Drawing Sheets

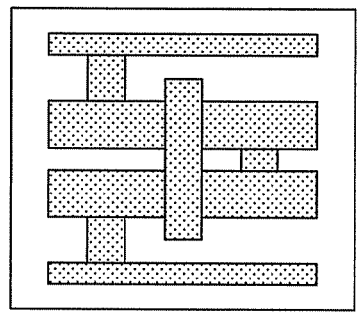
F I G. 3
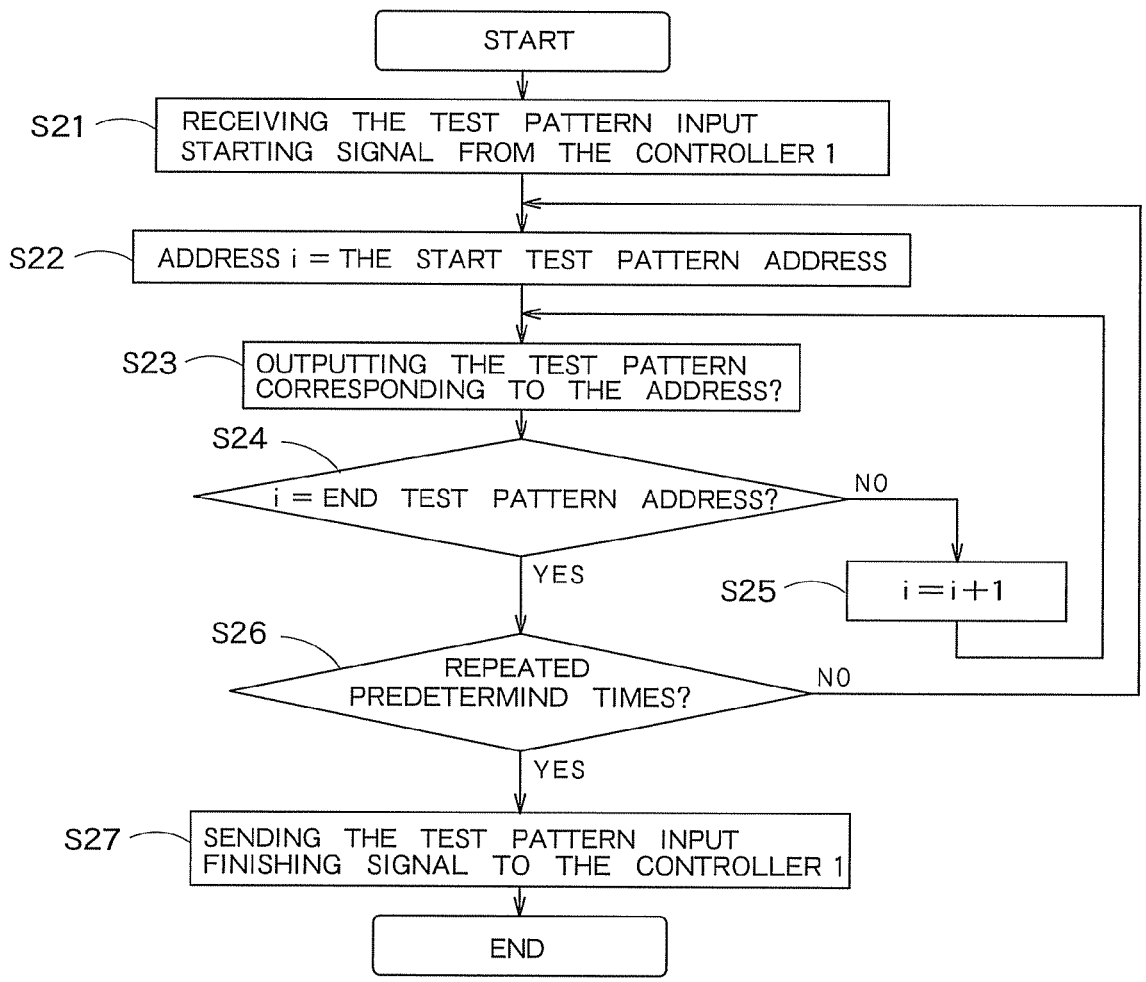
F I G. 4

(A) 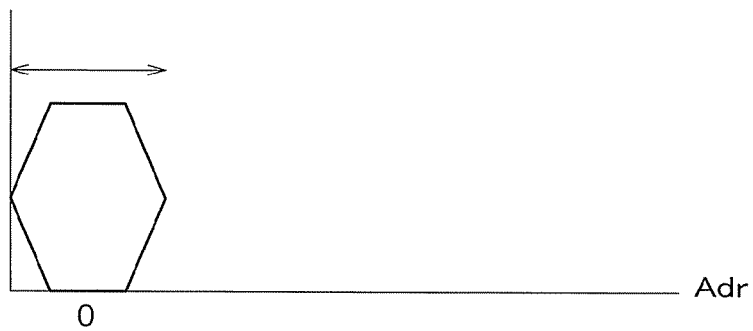
0
START TEST
PATTERN ADDRESS
= END TEST
PATTERN ADDRESS
(B) 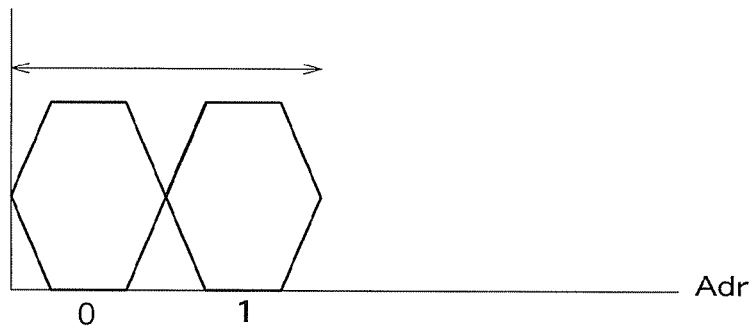
0                1
START        END
TEST         TEST
PATTERN   PATTERN
ADDRESS   ADDRESS
(C) 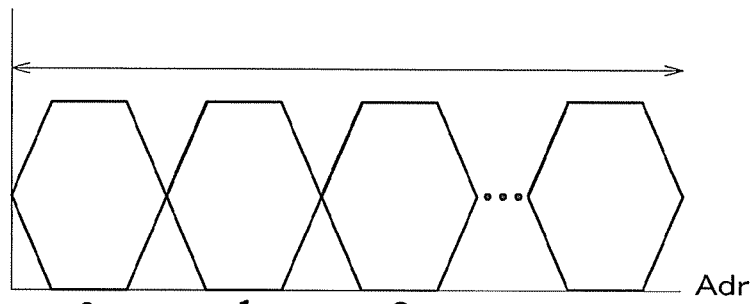
0           1      2              n
START                         END TEST
TEST                          PATTERN ADDRESS
PATTERN
ADDRESS                       = FINAL TEST
                              PATTERN ADDRESS
F I G. 6

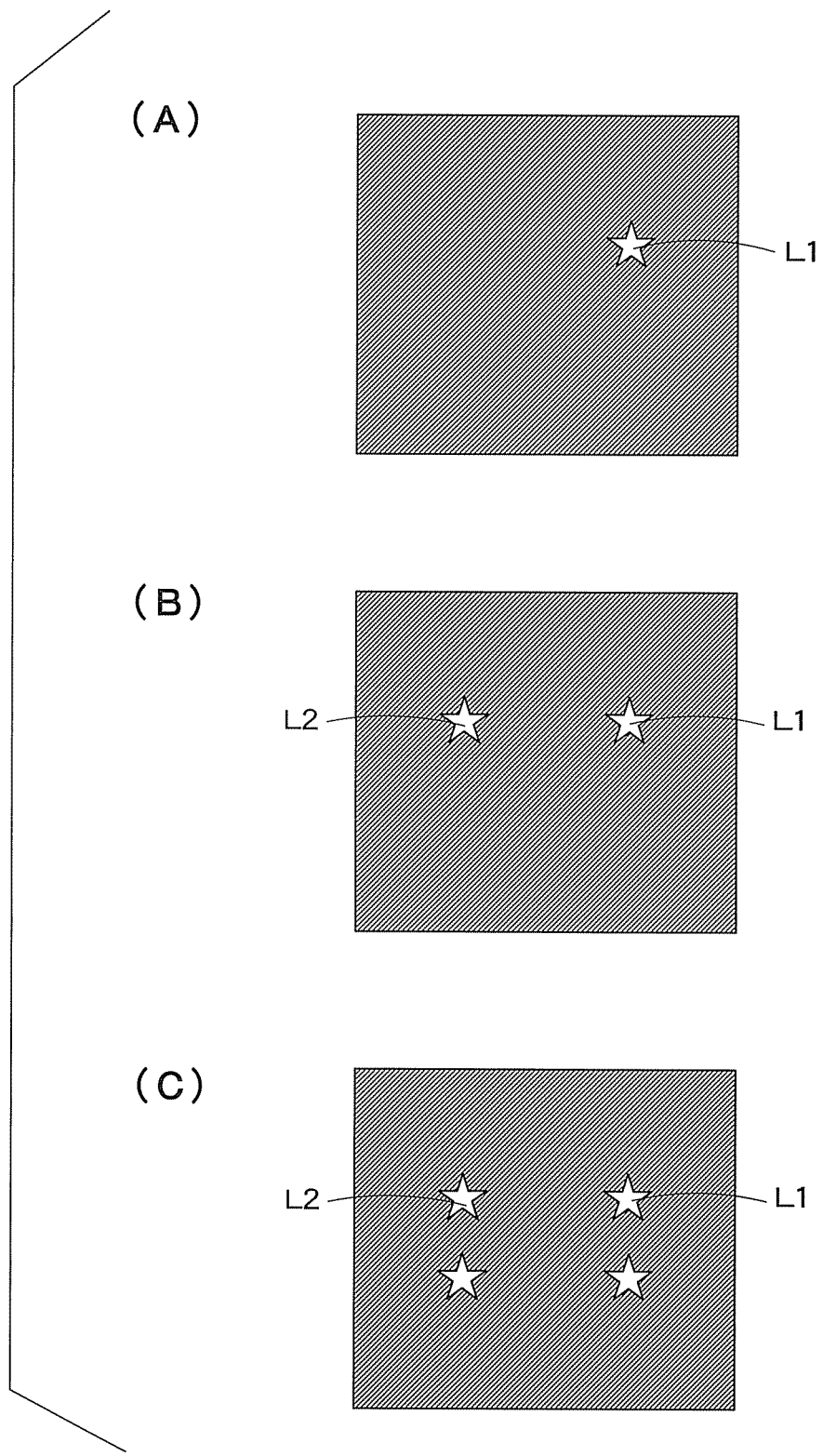
F I G. 7

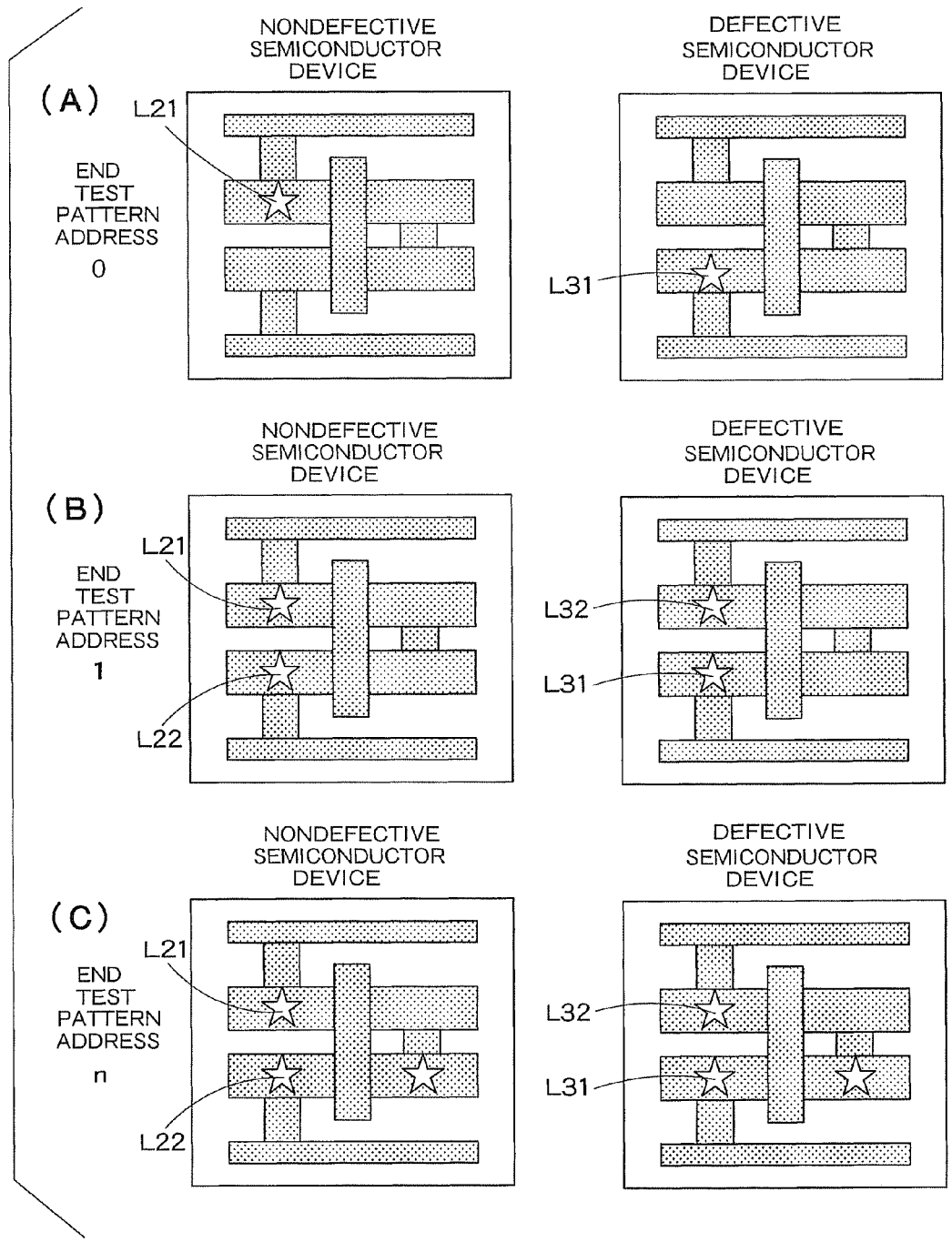
F I G. 10

EMISSION ANALYSIS DEVICE, METHOD AND SYSTEM

CROSS REFERENCE TO RELATED APPLICATIONS

This application is based upon and claims the benefit of priority from the prior Japanese Patent Application No. 2009-186494, filed on Aug. 11, 2009, the entire contents of which are incorporated herein by reference.

BACKGROUND OF THE INVENTION

1. Field of the Invention

The invention relates to an emission analysis device, method and system for identifying a defective location by detecting an emission of a semiconductor device.

2. Related Art

When a failure is detected in a semiconductor device, an emission analysis device for detecting an emission of the semiconductor device is used in order to identify a defective location. For example, a hot electron is generated due to a high field generated in a semiconductor element such as transistors, and this hot electron can cause the emission of the semiconductor device. Furthermore, abnormal current flows in the semiconductor elements or wires connecting the semiconductor elements, and heat is generated. The heat can also cause infra-red emission. Therefore, by using the emission analysis device, the defective location in the semiconductor device can be identified by comparing the emission of nondefective semiconductor device with that of defective one to detect a difference therebetween.

JP-A No. 2004-45132 (Kokai) (hereinafter, "Patent Document 1") discloses a technique to identify the defective location by inputting a plurality of test patterns to the semiconductor device without failure and that with failure, obtaining images obtained by integrating the emission of each semiconductor device, and detecting a difference between the both integrated images.

However, it is difficult to detect the difference from the integrated images although there is a difference of the emission timing between the both semiconductor devices. Furthermore, because Patent Document 1 detects only integrated image, there is a problem that even if there is a difference between the emissions of the both semiconductor devices on a specific test pattern, it cannot be detected that on which test pattern the difference of the emissions occur. In addition, when an occurrence frequency of the difference of the emission is extremely small comparing to the number of test patterns to be inputted, there is a likelihood that the difference cannot be detected correctly.

SUMMARY

According to one aspect of the present invention, an emission analysis device comprising: an image obtaining module configured to obtain a plurality of first images and a plurality of second images by changing multiple times an end test pattern address, the first images being obtained by integrating an emission from a nondefective semiconductor device determined to be nondefective by a function test while test patterns from a predetermined start test pattern address to the end test pattern address are inputted to the nondefective semiconductor device, the second images being obtained by integrating an emission from a defective semiconductor device determined to be defective by the function test while the test patterns from the predetermined start test pattern address to the end test pattern address are inputted to the defective semiconductor device; and a comparator configured to compare each of the first images with each of the second images by the end test pattern address to determine whether there is a difference between the first images and the second images.

According to the other aspect of the present invention, an emission analysis method comprising: obtaining a plurality of first images and a plurality of second images by changing multiple times an end test pattern address, the first images being obtained by integrating an emission from a nondefective semiconductor device determined to be nondefective by a function test while test patterns from a predetermined start test pattern address to the end test pattern address are inputted to the nondefective semiconductor device, the second images being obtained by integrating an emission from a defective semiconductor device determined to be defective by the function test while the test patterns from the predetermined start test pattern address to the end test pattern address are inputted to the defective semiconductor device; and comparing each of the first images with each of the second images by the end test pattern address to determine whether there is a difference between the first images and the second images.

According to the other aspect of the present invention, an emission analysis system comprising: a driver configured to input test patterns from a predetermined start test pattern address to the end test pattern address to a nondefective semiconductor device determined to be nondefective by a function test and to a defective semiconductor determined to be defective by the function test; an emission detector configured to detect an emission from the nondefective semiconductor device and the defective semiconductor device to which the test patterns are inputted, an image obtaining module configured to obtain a plurality of first images and a plurality of second images by changing an end test pattern address, the first images being obtained by integrating the emission from the nondefective semiconductor device while the test patterns from the predetermined start test pattern address to the end test pattern address are inputted to the nondefective semiconductor device, the second images being obtained by integrating the emission from the defective semiconductor device while the test patterns from the predetermined start test pattern address to the end test pattern address are, inputted to the defective semiconductor device; and a comparator configured to compare each of the first images with each of the second images by the end test pattern address to determine whether there is a difference between the first images and the second images.

BRIEF DESCRIPTION OF THE DRAWINGS

FIG. 3 is an example of the pattern image obtained by an emission detector 7.

FIG. 4 is a flowchart showing an example of processing operations of a driver 6.

FIGS. 6A to 6C are examples of test patterns generated by the driver 6.

FIGS. 7A to 7C are examples showing emission integrated images photographed by the emission detector 7.

FIGS. 10A to 10C show alternative examples of the combined emission integrated images of the nondefective and defective semiconductor devices.

DETAILED DESCRIPTION OF THE INVENTION

Hereinafter, an emission analysis device, method and system according to embodiments of the present invention will be specifically explained with reference to accompanying drawings.

Figure 1:
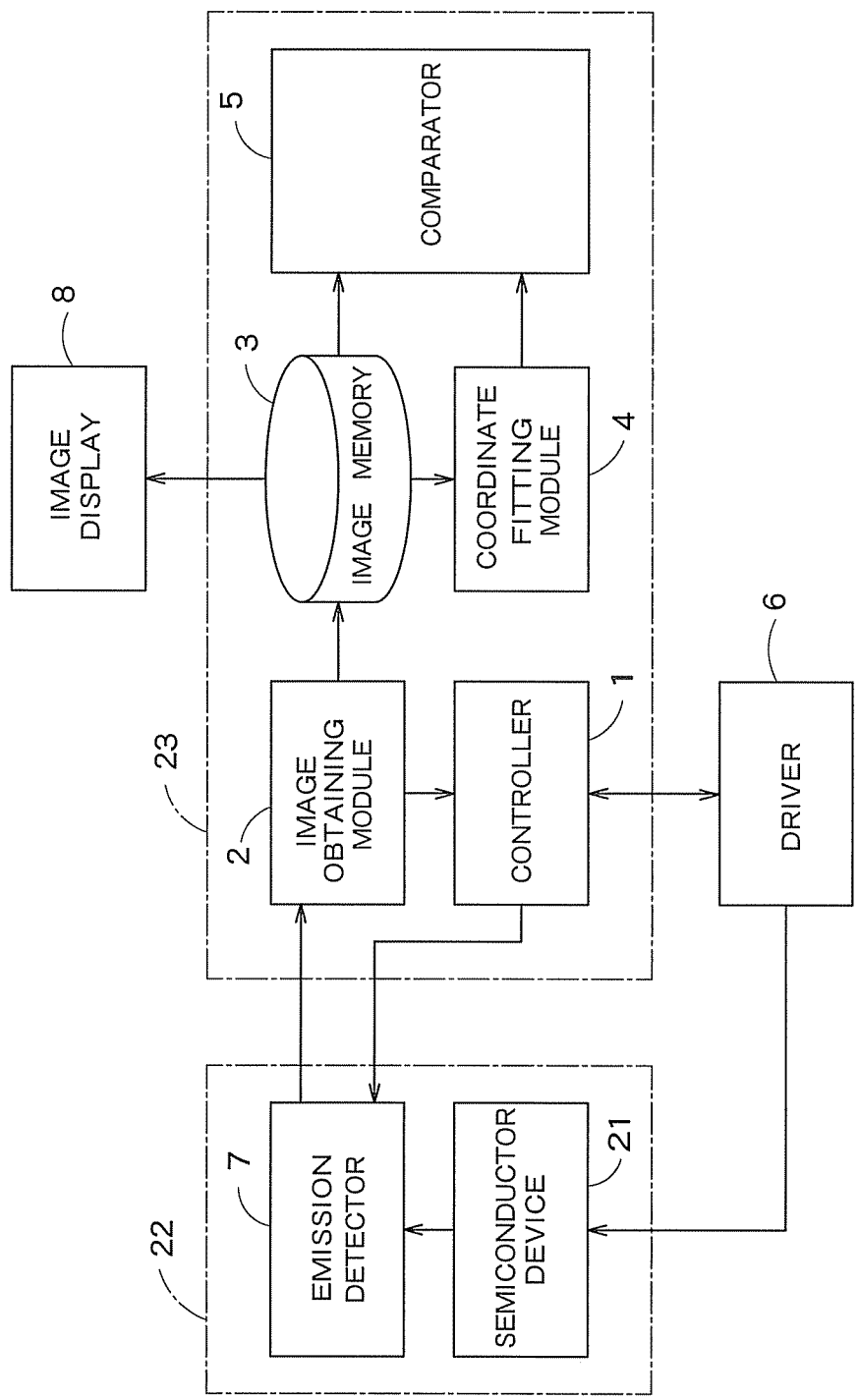
FIG. 1 is a block diagram showing an emission analysis system including an emission analysis device according to an embodiment.

FIG. 1 is a block diagram showing an emission analysis system including an emission analysis device according to an embodiment. The emission analysis system of FIG. 1 has a controller 1, an image obtaining module 2, an image memory 3, a coordinate fitting module 4, a comparator 5, a driver 6, an emission detector 7 and an image display 8.

The controller 1 sets a start test pattern address and an end test pattern address of the test patterns inputted to a semiconductor device 21 to the driver 6. Furthermore, the controller 1 controls photographing timing of the emission detector 7. The driver 6 inputs the test patterns from the start test pattern address to the end test pattern address to the semiconductor device 21 to be inspected to drive the semiconductor device 21, and outputs a signal indicating that the input to the semiconductor device 21 of the test patterns finishes to the controller 1.

The emission detector 7 is, for example, a high sensitive CCD (Charge Coupled Device) camera, and detects the emission from the semiconductor device 21 which is a non-packaged semiconductor wafer. It is one of characteristic features that the emission detector 7 and the semiconductor device 21 are placed in a dark box 22 and that the emission detector 7 can detect a week emission.

The image obtaining module 2 obtains an image photographed by the emission detector 7. The image memory 3 stores the image obtained by the image obtaining module 2. The coordinate fitting module 4 performs coordinate fitting to detect the corresponding coordinates of the image of the semiconductor device without failure (hereinafter, nondefective semiconductor device) (first image) and that with failure (hereinafter, defective semiconductor device) (second image). The comparator 5 reads out the images stored in the image memory 3 and compares the image of the nondefective semiconductor device with that of the defective one to determine whether there is differences therebetween. The image display 8 displays the images stored in the image memory 3 or the like.

The emission analysis device has at least the image obtaining module 2 and comparator 5, and the other components can be in the emission analysis device or can be another device. At least a component part of the emission analysis system can be implemented by software. The present embodiment shows an example where the controller 1, the image obtaining module 2, the image memory 3, the coordinate fitting module 4 and the comparator 5 can be implemented by a control device 23.

Figure 2:
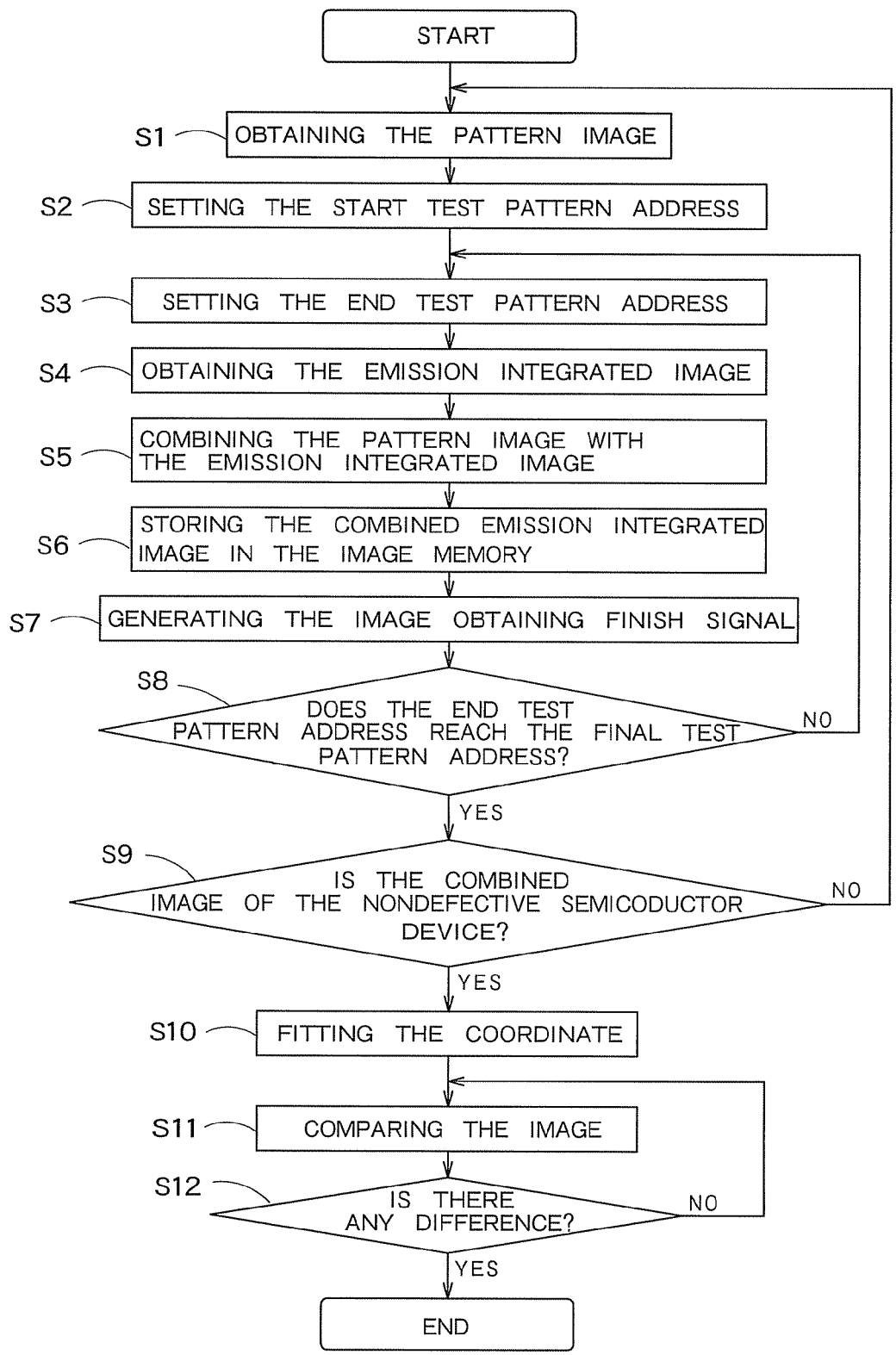
FIG. 2 is a flowchart showing an example of processing operations of a control device 23 of FIG. 1.

FIG. 2 is a flowchart showing an example of processing operations of the control device 23 of FIG. 1.

Firstly, a defective semiconductor device, in which a failure is found by conducting a function test or the like in advance, is placed in the dark box 22. The function test means a test where various test patterns are inputted to the semiconductor device by a semiconductor tester or the like to compare observed values and theoretical values of signals outputted to the external terminal of the semiconductor device. When a failure, namely, disagreement between the observed value and the theoretical value, is detected, the semiconductor device is determined to be defective one.

Secondly, with the inside of the dark box 22 lighted up once, the emission detector 7 photographs a pattern of semiconductor element and wires or the like formed on the semiconductor device 21, and the image obtaining module 2 obtains the pattern image (Step S1). FIG. 3 is an example of the pattern image obtained by the emission detector 7. The pattern image shown in FIG. 3 is used for coordinate fitting or the like, as described below.

Then, the controller 1 sets the start test pattern address to the driver 6 (Step S2). It is considered that there are some differences between the emission of the defective semiconductor device and that of the nondefective semiconductor device with regard to emission location and/or emission timing or the like. It is high possibility that the differences occur when the test pattern where the disagreement is detected between the observed value and the theoretical value or the previous test pattern is inputted. Therefore, the controller 1 sets the beginning address of the function test where the disagreement is detected to the driver 6 as the start test pattern address.

Furthermore, the controller 1 sets the end test pattern address to the driver 6 (Step S3). The initial, end test pattern address is set as same as the start test pattern address, and the following end test pattern addresses will be described below. The driver 6 will input the test patterns from the set start test pattern address to the end test pattern address by turns for a predetermined times.

Figure 5:
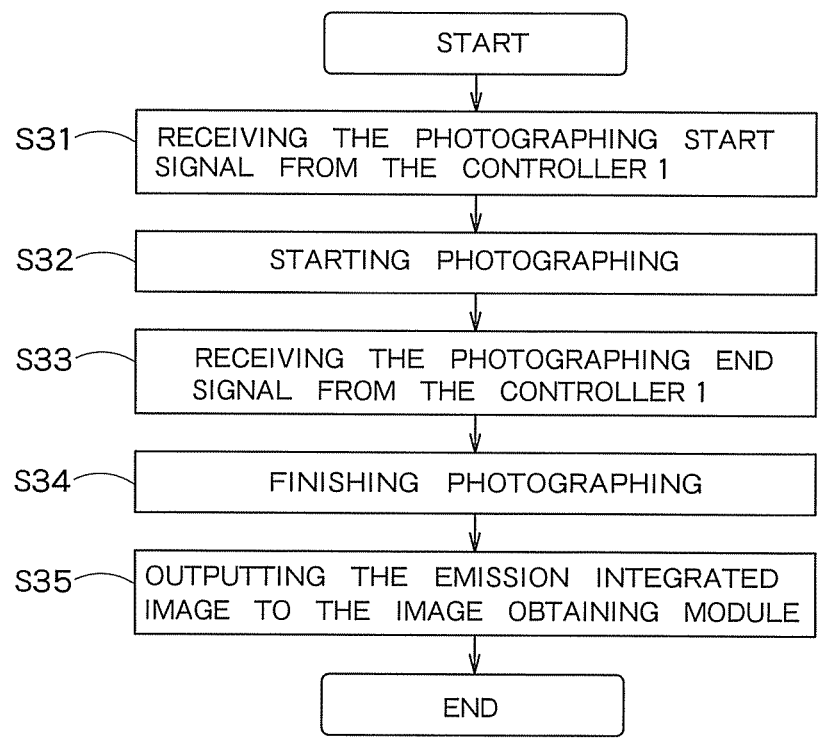
FIG. 5 is a flowchart showing an example of processing operations of the emission detector 7.

Then, with the dark box 22 light-blocked, the image obtaining module 2 obtains an emission integrated image of the semiconductor device 21 (Step S4). FIG. 4 is a flowchart showing an example of processing operations of the driver 6, and FIG. 5 is a flowchart showing an example of processing operations of the emission detector 7. With reference to FIG. 4 and FIG. 5, the processing of Step S4 will be explained in detail.

As shown in FIG. 4, when the driver 6 receives a test pattern input start signal generated by the controller 1 (Step S21), the address i is set to be the start test pattern address set in the processing of Step S2 of FIG. 2 (Step S22 of FIG. 4). Then, the driver 6 inputs the test pattern corresponding to the address i to the semiconductor device 21 (Step S23). When the address i does not reach the end test pattern address set in the processing of Step S3 of FIG. 2 (NO of Step S24 of FIG. 4), the driver 6 increments the address i by 1 (Step S25) and inputs the test pattern corresponding to the address i to the semiconductor device 21 (Step S23). These processings of Steps S23 to S25 are performed until the address i reaches the end test pattern address (Step S24).

Furthermore, the processings of Steps S22 to S25 are repeated for the predetermined times (Step S26). The reason to repeat for the predetermined times is that, although the emission is not necessarily detected by inputting the test pattern once because the emission from the semiconductor device 21 is week, the emission can be detected with high accuracy by inputting the test pattern for several times repeatedly and integrating the image by the emission detector 7, as will be described below. Therefore, the predetermined times have to be enough times to surely detect the emission When the input of test patterns for the above times (YES of the Step S26), the driver 6 sends a test pattern input end signal indicating that the input of the test patterns are finished to the controller 1 (Step S27).

FIGS. 6A to 6C are examples of the test patterns generated by the driver 6. For example, when both of the start test pattern address and the end test pattern address are "0", the driver 6 outputs the test pattern corresponding to the address "0" to the semiconductor device 21 for the predetermined times repeatedly as shown in FIG. 6A. Furthermore, when the start test pattern address is "0" and the end test pattern address is "1", the driver 6 outputs the test patterns corresponding to the address "0" and address "1" to the semiconductor device 21 for the predetermined times repeatedly as shown in FIG. 6B.

On the other hand, after the controller 1 sets the end test pattern address to the driver 6 (Step S3 of FIG. 2) and before the controller 1 sends the test pattern input start signal to the driver 6 (Step S21 of FIG. 4), the controller 1 generates a photographing start signal to send the signal to the emission detector 7. When the emission detector 7 receives the photographing start signal (Step S31 of FIG. 5), the emission detector 7 opens a shutter of the camera to start photographing (Step S32).

Then, when the controller 1 receives the test pattern input end signal from the driver 6 (Step S27 of FIG. 4), the controller 1 generates a photographing end signal to send the signal to the emission detector 7. When the emission detector 7 receives the photographing end signal (Step S33 of FIG. 5), the emission detector 7 closes the shutter of the camera to finish photographing (Step S34).

As mentioned above, while the inputs of the test patterns from the start test pattern address to the end test pattern address are repeated for the determined times, the emission detector 7 keeps the shutter opened, thereby integrating the image of the semiconductor device 21 by multiple exposure. Therefore, the emission detector 7 can precisely detect the emission of the semiconductor device 21 even if the emission of the semiconductor device 21 is week. After photographing, the emission detector 7 outputs the photographed emission integrated image to the image obtaining module 2 (Step S35).

FIGS. 7A to 7C are examples showing the emission integrated images photographed by the emission detector 7. For example, when both of the start test pattern address and the end test pattern address are "0", the emission detector 7 obtains the emission integrated image where detected is an emission L1, which occurs when inputting the test pattern corresponding to the address "0" to the semiconductor device 21, as shown in FIG. 7A. Furthermore, when the start test pattern address is "0" and the end test pattern address is "1", the emission detector 7 obtains the emission integrated image where are detected both of the emission L1, which occurs when inputting the test pattern corresponding to the address "0" to the semiconductor device 21, and an emission L2, which occurs when inputting the test pattern corresponding to the address "1" to the semiconductor device 21, as shown in FIG. 7B.

Thus, the image obtaining module 2 obtains the emission integrated image of the semiconductor device 21 (Step S4 of FIG. 2).

In addition, the image obtaining module 2 combines the pattern image obtained in the processing of Step S1 with the emission integrated image obtained in the processing of Step S4 to generate a combined emission integrated image (Step S5) in order to clarify the emission location of the semiconductor device 21. This combined emission integrated image is stored in the image memory 3 in association with the end test pattern address (Step S6).

Figure 8:
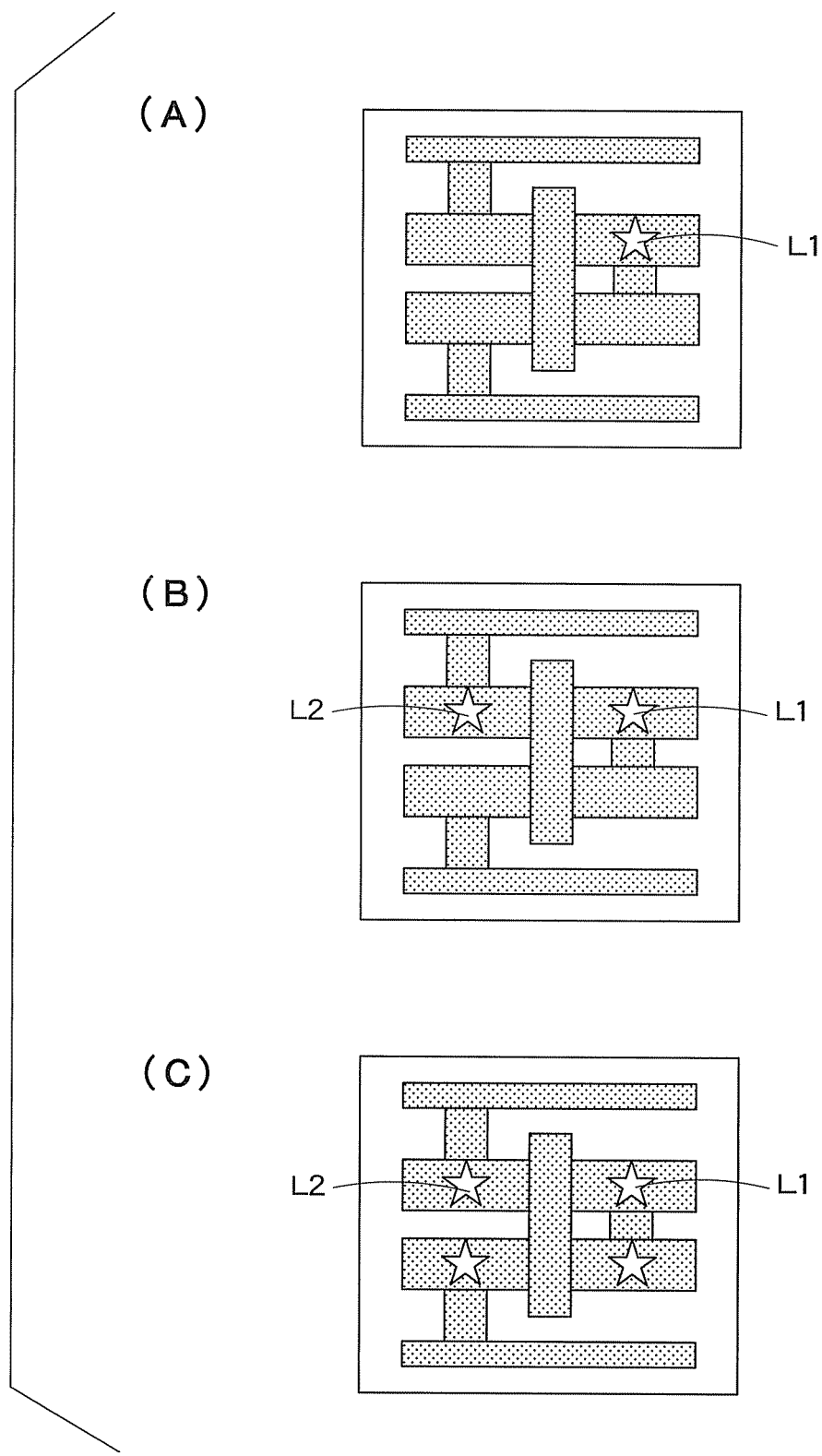
FIGS. 8A to 8C are examples of combined emission integrated images generated by an image obtaining module 2.

FIGS. 8A to 8C are examples of the combined emission integrated images generated by the image obtaining module 2. For example, when both of the start test pattern address and the end test pattern address are "0", the image obtaining module 2 combines the pattern image shown in FIG. 3 with the emission integrated image shown in FIG. 7A to generate the combined emission integrated image shown in FIG. 8A. Furthermore, when the start test pattern address is "0" and the end test pattern address is "1", the image obtaining module 2 combines the pattern image shown in FIG. 3 with the emission integrated image shown in FIG. 7B to generate the combined emission integrated image shown in FIG. 8B.

In addition, when the image obtaining module 2 obtains the emission integrated image, the image obtaining module 2 generates an image obtaining end signal (Step S7 of FIG. 2) to send the signal to the controller 1. When the controller 1 receives the image obtaining end signal, the controller 1 determines whether the end test pattern address reaches a final test pattern address (Step S8). When the end test pattern address does not reach the final test pattern address (No of Step S8), the controller 1 sets a value obtained by adding the end test pattern address by a predetermined address shifting step as the end test pattern address (Step S3). Note that FIG. 6 shows an example where the address shifting step is "1".

Here, the final test pattern address means an address where the disagreement is detected in the above mentioned function test. It is considered that there are some differences between the emission from the defective semiconductor device and that from the nondefective semiconductor device when the test pattern corresponding to the final test pattern address or the previous address of the final test pattern address is inputted. Therefore the processings of Steps S3 to S7 are performed until the end test pattern address reaches the final test pattern address.

For example, the final test pattern address is "n", the emission integrated images obtained by inputting the test patterns shown in FIGS. 6A to 6C (FIGS. 7A to 7C) are combined with the pattern image (FIG. 3), and "n+1" combined emission integrated images shown in FIGS. 8A to 8C are stored in the image memory 3 in association with the end test pattern address "0" to "n", respectively.

When the end test pattern address reaches the final test pattern address (YES of Step S8), in order to obtain the combined emission integrated image of the semiconductor device determined to be good item by the function test (nondefective semiconductor device) (NO of Step S9), the defective semiconductor device in the dark box 22 is brought out and the nondefective semiconductor device is placed in the dark box 22. Then, the processings which are the same as Steps S1 to S8 are performed in the nondefective semiconductor device, and the combined emission integrated images of the nondefective semiconductor device are stored in the image memory 3.

When the combined emission integrated images of the nondefective semiconductor device are obtained (YES of Step S9), the coordinate fitting module 4 performs pattern matching using the pattern image included in the combined emission integrated image to detect the shift of photographing position between the nondefective and defective semiconductor devices and performs coordinate fitting for calculating the corresponding coordinate of the combined emission integrated images of the both semiconductor devices (Step S10). Although the both semiconductor devices are not necessarily strictly photographed at the same position, by performing the coordinate fitting, the combined emission integrated images can be compared even if the photographing positions differ from each other.

Next, the comparator 5 reads out the combined emission images of the nondefective and defective semiconductor devices stored in the image memory 3 and compares combined emission integrated images to determine whether there are some differences between both images (Step S11 of FIG. 2) by the end test pattern address. Here, taking the coordinate fitting result into consideration, the corresponding positions of the both images are compared. The comparison is performed in order of the small end test pattern address. When there are no differences between the both images (NO of Step S12), the end test pattern address is updated and the comparison is performed in the combined emission integrated images of the next end test pattern address (Step S11). When there is a difference (Yes of Step S12), the position can be identified as the failure position. At the same time, since the test patterns causing the difference can be identified, the cause can also be estimated by logic simulation or the like.

When the difference is detected (YES of Step S12), the emission analysis system finishes updating the end test pattern address to finish the processing. By finishing the comparing at a time when the difference is detected, even if there are a large number of the addresses from the start test pattern address to the final test pattern address, a time required for analysis can be shortened.

Note that an analyzer can perform the coordinate fitting of Step S10 and/or the comparison of the combined emission integrated images of Step S11 manually with the combined emission integrated images displayed on the image display 8.

Thus, in the present embodiment, the comparison processing is performed in order of the small end test pattern address. In other words, the comparison processing is performed in the combined emission integrated images whose end test pattern address is close to the start test pattern address preferentially, thereby identifying the failure position in short time.

FIGS. 9A to 9C show examples of the combined emission integrated images of the nondefective and defective semiconductor devices. The FIGS. 9A, 9B and 9C correspond to the end test pattern addresses of "0", "1" and "n" ("n" is the final test pattern address), respectively. With reference to FIGS. 9A to 9C, the processing operations of the comparator 5 will be specifically explained. Firstly, the comparator 5 compares the both images of the end test pattern address of "0" (Step S11 of FIG. 2). In the example of FIG. 9A, the both images have an emission L1 and there are no differences (No of Step S12 of FIG. 2). Therefore, the comparator 5 then compares the both images of the end test pattern address of "1" (Step S11). In the example of FIG. 9B, the both images further have an emission L12 but only the combined emission integrated image of the defective semiconductor device has an abnormal emission L13, and there is a difference. Therefore, it can be found that a failure occurs at the position of the emission L13.

Figure 9:
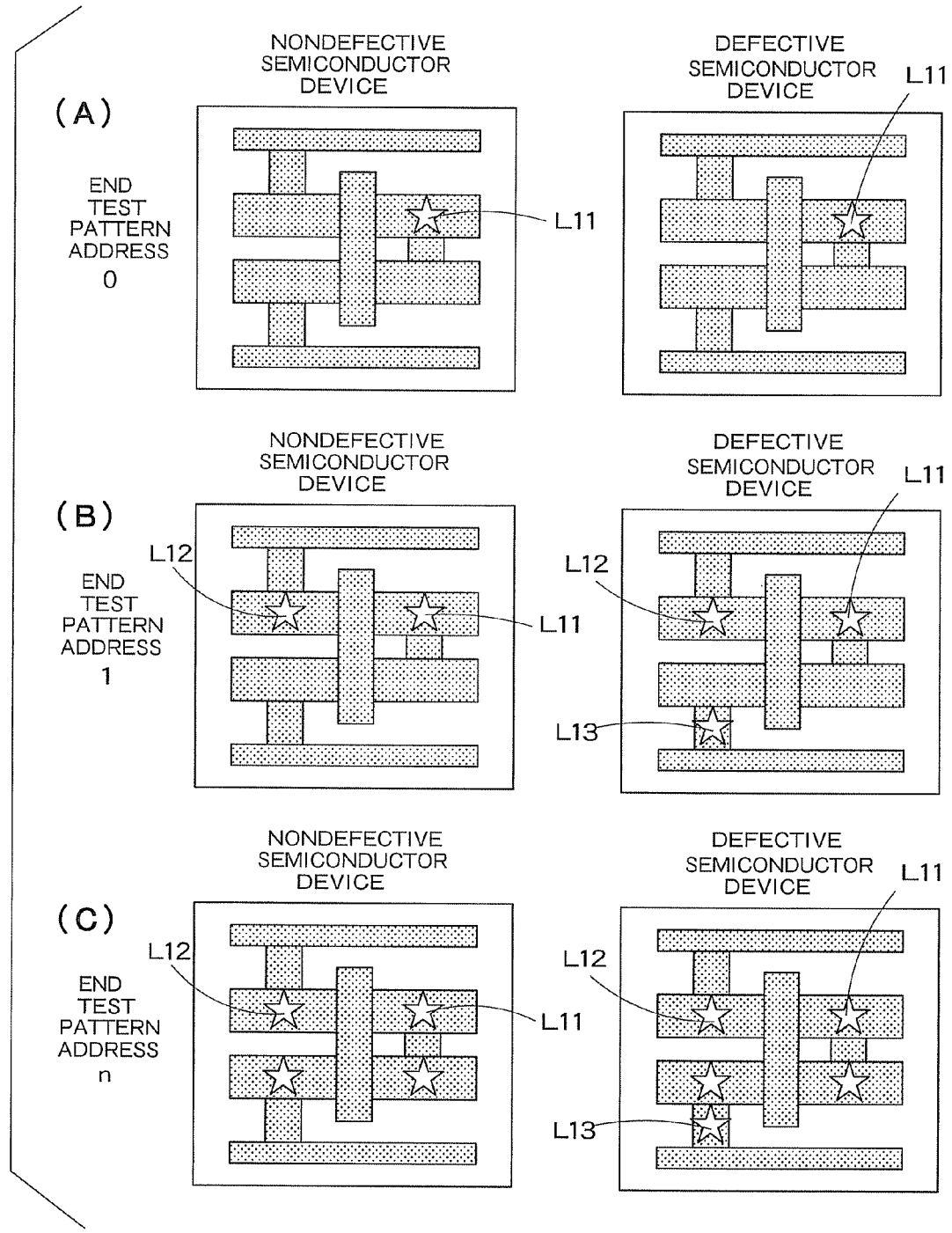
FIGS. 9A to 9C show examples of combined emission integrated images of the nondefective and defective semiconductor devices.

In FIG. 9, it is assumed that the abnormal emission L13 occurs only when the test pattern corresponding to the address "1" is inputted to the defective semiconductor device. Then, if the processing of obtaining a plurality of combined emission integrated images by changing the end test pattern address is not performed and if the comparison is performed only by obtaining the combined emission integrated image of the start test pattern address to the end test pattern address "n" shown in FIG. 9C, the number of addresses from the start test pattern address to the final test pattern address is "n+1" whereas the emission L13 occurs only at address "1", and the frequency of the emission L13 to occur is extremely small. Therefore, there is a likelihood that the abnormal emission L13 cannot be detected and that the failure position cannot be identified.

On the other hand, in the present embodiment, a plurality of combined emission integrated images are obtained by changing the end test pattern address, and the comparison is performed in order of small end test pattern address. Therefore, in the example of FIG. 9B, the frequency of the emission L13 to occur becomes relatively large comparing to the number of the addresses of "2" from the start test pattern address to the end test pattern address "1". Accordingly, by comparing the combined integrated images of end test pattern address of "1", the difference of presence/absence of the emission L13 can be simply and precisely detected, thereby identifying the failure position.

FIGS. 10A to 10C show alternative examples of the combined emission integrated images of the nondefective and defective semiconductor devices. The FIGS. 10A, 10B and 10C correspond to the end test pattern addresses of "0", "1" and "n" ("n" is the final test pattern address), respectively. As shown in FIG. 10A, when the test pattern corresponding to address "0" is inputted, the nondefective semiconductor device has an emission L21 while the defective semiconductor device has an abnormal emission L31 at different position. Furthermore, as shown in FIG. 10B, when the test pattern corresponding to address "1" is inputted, the nondefective semiconductor device has an emission L22 at the same position as that of the emission L31 while the defective semiconductor device has an abnormal emission L32 at the same position as that of the emission L21. That is, in the both semiconductor devices, the position of the emissions is the same and only the timing differs from each other.

In this case, if the processing of obtaining a plurality of combined emission integrated images by changing the end test pattern address is not performed and if obtaining only the combined emission integrated image of the start test pattern address to the end test pattern address "n" shown in FIG. 10C, because the difference is only in timing, the difference cannot be detected by the combined emission integrated image of FIG. 10C obtained by integrating. Therefore, the failure position cannot be identified.

On the other hand, in the present embodiment, a plurality of combined emission integrated images are obtained by changing the end test pattern address, and comparison is performed in order of small test pattern address. Therefore, by comparing the combined emission integrated images of the end test pattern address of "0", the difference between the nondefective semiconductor device and the defective semiconductor device can be detected, thereby identifying the failure position.

As stated above, in the present embodiment, a plurality of combined emission integrated images are obtained by changing the end test pattern address, and the comparison of the combined emission integrated image of the nondefective semiconductor device with that of the defective semiconductor is performed in order of the small end test pattern address, namely, in order of the end test pattern address close to the start test pattern address. Therefore, in a case where the frequency of the abnormal emission in the defective semiconductor device to occur is small and/or in a case where the difference of the emission between the both semiconductor devices is only in the timing, the difference in the combined emission integrated images can be precisely detected, thereby identifying the failure position correctly. Furthermore, because the comparison is finished when the difference is detected, a time required for analysis can be shortened even if there are a large number of addresses from the start test pattern address to the final test pattern address. In addition, because controller 1 automatically performs the control of the photographing timing of the emission detector 7 and the update of the end test pattern address, the analyzer does not have to perform these operations, thereby identifying the failure position without effort of the analyzer.

Note that in this present embodiment, the comparison of the combined emission integrated image is performed in order of the small end test pattern address, namely, in order of the end test pattern address close to the start test pattern address. However, the comparison of the combined emission integrated image is performed in order of the large end test pattern address, namely, in order of the end test pattern address close to the final test pattern address. As mentioned above, the final test pattern address is an address where the disagreement is detected in the function test. Therefore, the difference between the combined emission integrated images can occur at the test pattern address close to the final test pattern address. In this case, the difference can be detected in shorter time by comparing in order of the large end test pattern address. Furthermore, when the comparison is started at the test pattern address close to the start test pattern address, there is a likelihood that the test pattern address corresponding to the difference is already passed. However, by comparing in order of the end test pattern address close to the final test pattern address lessening the test pattern address, the difference can surely detected.

In FIG. 6 or the like, an example is shown where the end test pattern address is changed by the address shifting step value of "1". However, the address shifting step value can be arbitral. The address shifting step value can be set according to the number of addresses from the start test pattern address to the end test pattern address.

When the sensitivity of the emission detector 7 is high or the like, the test patterns are inputted to the semiconductor device 21 only once without repeating for the predetermined times.

The emission detector 7 photographs the pattern image and the emission integrated image with the same magnification. The magnification is set so that the emission of the semiconductor device 21 can be detected. Furthermore, in order to detect the week emission precisely, it is preferable that only a part of the semiconductor device 21 is photographed by setting the magnification large.

If the failure position cannot be identified even if above manner is used, another emission analysis can be performed by changing the time to input the test patterns to the semiconductor device 21 repeatedly, the magnification of photographing, the address shifting step value and/or the start test pattern address.

The above embodiment shows an example where the emission integrated image is obtained by observing the emission of the nondefective semiconductor device. However, the emission integrated image can be obtained by simulation in a case where the test patterns are inputted to the nondefective semiconductor device without observing the emission practically. Because of this, the failure position can be identified more simply.

At least a part of the emission analysis system explained in the above embodiments can be formed of hardware or software. When the emission analysis system is partially formed of the software, it is possible to store a program implementing at least a partial function of the emission analysis system in a recording medium such as a flexible disc, CD-ROM, etc. and to execute the program by making a computer read the program. The recording medium is not limited to a removable medium such as a magnetic disk, optical disk, etc., and can be a fixed-type recording medium such as a hard disk device, memory, etc.

Further, a program realizing at least a partial function of the emission analysis system can be distributed through a communication line (including radio communication) such as the Internet etc. Furthermore, the program which is encrypted, modulated, or compressed can be distributed through a wired line or a radio link such as the Internet etc. or through the recording medium storing the program.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. An emission analysis device comprising:
    an image obtaining module configured to obtain a plurality of first images and a plurality of second images by changing multiple times an end test pattern address, the first images being obtained by integrating an emission from a nondefective semiconductor device determined to be nondefective by a function test while test patterns from a predetermined start test pattern address to the end test pattern address are inputted to the nondefective semiconductor device, the second images being obtained by integrating an emission from a defective semiconductor device determined to be defective by the function test while the test patterns from the predetermined start test pattern address to the end test pattern address are inputted to the defective semiconductor device and the defective semiconductor device is driven according to the inputted test pattern; and
    a comparator configured to compare each of the first images with each of the second images by the end test pattern address to determine whether there is a difference between the first images and the second images.

2. The device of claim 1, wherein the image obtaining module obtains the plurality of first images and the plurality of second images by changing the end test pattern address by turns from an address close to the start test pattern address until a final test pattern address determined to be failure by the function test, and
    the comparator compares each of the first images with each of the second images by changing the end test pattern address by turns from an address close to the start test pattern address or the final test pattern address.

3. The device of claim 2, wherein the comparator finishes changing the end test pattern address when a difference is found between the first images and the second images.

4. The device of claim 1, further comprising a controller configured to generate the new end test pattern address when receiving an image obtaining end signal to generate the test patterns from the predetermined start test pattern address to the new end test pattern address, the image obtaining end signal being generated every time when the image obtaining module finishes obtaining one of the first images or one of the second images.

5. The device of claim 1, further comprising a coordinate fitting module configured to detect a coordinate shift between the first images and the second images based on a first combined emission integrated image obtained by combining a pattern image of the nondefective semiconductor device and one of the first images and a second combined emission integrated image obtained by combining a pattern image of the defective semiconductor device and one of the second images;
    wherein the comparator compares the first combined emission integrated image with the second combined emission integrated image to determine whether a difference is found between the first and the second combined emission images in consideration of the coordinate shift.

6. The device of claim1, wherein the image obtaining module obtains the first images and the second images by integrating the emission from the nondefective and the defective semiconductor devices while test patterns from the predetermined start test pattern address to the end test pattern address are repeatedly inputted multiple times to the nondefective and the defective semiconductor devices.

7. The device of claim 1, wherein the image obtaining module obtains the first images by a simulation or by a measurement.

8. An emission analysis method comprising:
obtaining a plurality of first images and a plurality of second images by changing multiple times an end test pattern address, the first images being obtained by integrating an emission from a nondefective semiconductor device determined to be nondefective by a function test while test patterns from a predetermined start test pattern address to the end test pattern address are inputted to the nondefective semiconductor device, the second images being obtained by integrating an emission from a defective semiconductor device determined to be defective by the function test while the test patterns from the predetermined start test pattern address to the end test pattern address are inputted to the defective semiconductor device and the defective semiconductor device is driven according to the inputted test pattern; and
comparing each of the first images with each of the second images by the end test pattern address to determine whether there is a difference between the first images and the second images.

9. The method of claim 8, wherein upon obtaining the first images and the second images, the first images and the second images are obtained by changing the end test pattern address by turns from an address close to the start test pattern address until a final test pattern address determined to be failure by the function test, and
upon comparing each of the first images with each of the second images, each of the first images is compared with each of the second images by changing the end test pattern address by turns from an address close to the start test pattern address or the final test pattern address.

10. The method of claim 9, wherein upon comparing each of the first images with each of the second images, changing the end test pattern address is finished when there a difference is found between the first images and the second images.

11. The method of claim 8, further comprising generating the new end test pattern address when an image obtaining end signal is generated and generating the test patterns from the predetermined start test pattern address to the new end test pattern address, the image obtaining end signal being generated every time when obtaining one of the first images or one of the second images is finished.

12. The method of claim 8, further comprising detecting a coordinate shift between the first images and the second images based on a first combined emission integrated image obtained by combining a pattern image of the nondefective semiconductor device and one of the first images and a second combined emission integrated image obtained by combining a pattern image of the defective semiconductor device and one of the second images;
wherein upon comparing each of the first images with each of the second images, the first combined emission integrated image is compared with the second combined image to determine whether a difference is found between the first and the second combined emission images in consideration of the coordinate shift.

13. The method of claim 8, wherein upon obtaining the first images and the second images, the first images and the second images are obtained by integrating the emission from the nondefective and the defective semiconductor devices while test patterns from the predetermined start test pattern address to the end test pattern address are repeatedly inputted multiple times to the nondefective and the defective semiconductor devices.

14. The method of claim 8, wherein upon obtaining the first images and the second images, the first images are obtained by a simulation or by a measurement.

15. An emission analysis system comprising:
a driver configured to input test patterns from a predetermined start test pattern address to the end test pattern address to a nondefective semiconductor device determined to be nondefective by a function test and to a defective semiconductor determined to be defective by the function test;
an emission detector configured to detect an emission from the nondefective semiconductor device and the defective semiconductor device to which the test patterns are inputted,
an image obtaining module configured to obtain a plurality of first images and a plurality of second images by changing an end test pattern address, the first images being obtained by integrating the emission from the nondefective semiconductor device while the test patterns from the predetermined start test pattern address to the end test pattern address are inputted to the nondefective semiconductor device, the second images being obtained by integrating the emission from the defective semiconductor device while the test patterns from the predetermined start test pattern address to the end test pattern address are inputted to the defective semiconductor device and the defective semiconductor device is driven according to the inputted test pattern; and
a comparator configured to compare each of the first images with each of the second images by the end test pattern address to determine whether there is a difference between the first images and the second images.

16. The system of claim 15, wherein the image obtaining module obtains the plurality of first images and the plurality of second images by changing the end test pattern address by turns from an address close to the start test pattern address until a final test pattern address determined to be failure by the function test, and
the comparator compares each of the first images with each of the second images by changing the end test pattern address by turns from an address close to the start test pattern address or the final test pattern address.

17. The system of claim 16, wherein the comparator finishes changing the end test pattern address when a difference is found between the first images and the second images.

18. The system of claim 15, further comprising a controller configured to generate the new end test pattern address when receiving an image obtaining end signal to generate the test patterns from the predetermined start test pattern address to the new end test pattern address, the image obtaining end signal being generated every time when the image obtaining module finishes obtaining one of the first images or one of the second images.

19. The system of claim 15, further comprising a coordinate fitting module configured to detect a coordinate shift between the first images and the second images based on a first combined emission integrated image obtained by combining a pattern image of the nondefective semiconductor device and one of the first images and a second combined emission integrated image obtained by combining a pattern image of the defective semiconductor device and one of the second images;

wherein the comparator compares the first combined emission integrated image with the second combined emission integrated image to determine whether a difference is found between the first and the second combined emission images in consideration of the coordinate shift.

20. The system of claim 15, wherein the image obtaining module obtains the first images and the second images by integrating the emission from the nondefective and the defective semiconductor devices while test patterns from the predetermined start test pattern address to the end test pattern address are repeatedly inputted multiple times to the nondefective and the defective semiconductor devices.

\* \* \* \* \*